United States Patent
Thielemans et al.

(10) Patent No.: US 12,455,056 B2
(45) Date of Patent: Oct. 28, 2025

(54) PHOTOVOLTAIC SUNSHADE AND DISPLAY SYSTEM

(71) Applicant: Stereyo BV, Nazareth (BE)

(72) Inventors: Robbie Thielemans, Nazareth (BE); Vince Dundee, Glendale, CA (US)

(73) Assignee: STEREYO BV, Nazareth (BE)

( * ) Notice: Subject to any disclaimer, the term of this patent is extended or adjusted under 35 U.S.C. 154(b) by 124 days.

(21) Appl. No.: 17/883,382

(22) Filed: Aug. 8, 2022

(65) Prior Publication Data

US 2024/0044465 A1 Feb. 8, 2024

(51) Int. Cl.
| | |
|---|---|
| F21S 9/03 | (2006.01) |
| E04H 6/02 | (2006.01) |
| F21V 15/01 | (2006.01) |
| F21V 21/15 | (2006.01) |
| F21V 21/30 | (2006.01) |
| F21V 33/00 | (2006.01) |
| G09F 9/33 | (2006.01) |
| H02S 20/32 | (2014.01) |
| H02S 40/38 | (2014.01) |

(Continued)

(52) U.S. Cl.
CPC .............. *F21S 9/037* (2013.01); *E04H 6/025* (2013.01); *F21V 15/012* (2013.01); *F21V 21/15* (2013.01); *F21V 21/30* (2013.01); *F21V 33/006* (2013.01); *G09F 9/33* (2013.01); *H02S 20/32* (2014.12); *H02S 40/38* (2014.12); *F21Y 2105/16* (2016.08); *F21Y 2115/10* (2016.08)

(58) Field of Classification Search
CPC ...................................................... F21S 9/037
See application file for complete search history.

(56) References Cited

U.S. PATENT DOCUMENTS

| | | |
|---|---|---|
| 5,767,818 A | 6/1998 | Nishida |
| 6,055,071 A | 4/2000 | Kuwata et al. |
| 6,483,555 B1 | 11/2002 | Thielemans et al. |

(Continued)

FOREIGN PATENT DOCUMENTS

| | | |
|---|---|---|
| BE | 20195196 | 3/2019 |
| BE | 20195142 | 7/2019 |

(Continued)

OTHER PUBLICATIONS

Baker, Simon, "Pulse Width Modulation (PWM)", Mar. 17, 2015, 13 pages, TFT Central.

(Continued)

*Primary Examiner* — Sean P Gramling
(74) *Attorney, Agent, or Firm* — Workman Nydegger (57) ABSTRACT

An at least partially self-powered photovoltaic sunshade and display system is provided, including a plurality of panels arranged in an array. Each of the plurality of panels has two sides, including a first side including a plurality of photovoltaic cells or a photovoltaic layer, and a second side having an array of light-emitting elements. The at least partially self-powered photovoltaic sunshade and display system includes energy storage means that receives charge from the plurality of panels and provides electrical power to the array of light-emitting elements. Each of the plurality of panels is rotatable about an axis such that the two sides are respectively rotatable towards or away from the sun, and towards or away from an exterior environment.

28 Claims, 7 Drawing Sheets

(51) Int. Cl.
*F21Y 105/16* (2016.01)
*F21Y 115/10* (2016.01)

(56) References Cited

U.S. PATENT DOCUMENTS

| | | | |
|---|---|---|---|
| 6,717,625 B1 | 4/2004 | Thielemans | |
| 7,015,902 B2 | 3/2006 | Nagai et al. | |
| 7,019,721 B2 | 3/2006 | Thielemans et al. | |
| 7,071,620 B2 | 7/2006 | Devos et al. | |
| 7,071,894 B1 | 7/2006 | Thielemans et al. | |
| 7,079,092 B2 | 7/2006 | Tanghe et al. | |
| 7,102,601 B2 | 9/2006 | Devos et al. | |
| 7,157,838 B2 | 1/2007 | Thielemans et al. | |
| 7,176,861 B2 | 2/2007 | Dedene et al. | |
| 7,205,729 B2 | 4/2007 | Thielemans et al. | |
| 7,227,519 B1 | 6/2007 | Kawase et al. | |
| 7,262,753 B2 | 8/2007 | Tanghe et al. | |
| 7,301,273 B2 | 11/2007 | Dedene et al. | |
| 7,365,720 B2 | 4/2008 | Bouwens et al. | |
| 7,443,466 B2 | 10/2008 | Dedene et al. | |
| 7,777,691 B1 | 8/2010 | Nimmer et al. | |
| 7,877,910 B2 | 2/2011 | Thorjussen et al. | |
| D730,309 S | 5/2015 | Hochman et al. | |
| 9,069,519 B1 | 6/2015 | Hall | |
| D751,998 S | 3/2016 | Hochman et al. | |
| 9,380,720 B2 | 6/2016 | Thielemans et al. | |
| 9,477,438 B1 | 10/2016 | Hochman et al. | |
| D771,844 S | 11/2016 | Hochman et al. | |
| 9,524,666 B2 | 12/2016 | Hochman et al. | |
| 9,660,403 B2 | 5/2017 | Hochman et al. | |
| 10,325,541 B2 | 6/2019 | Hochman et al. | |
| 10,333,109 B2 | 6/2019 | Hochman et al. | |
| 10,892,297 B2 | 1/2021 | Chae et al. | |
| 10,917,679 B2 | 2/2021 | Dunning et al. | |
| 11,310,436 B2 | 4/2022 | Hochman et al. | |
| 11,328,655 B2 | 5/2022 | Sugiyama et al. | |
| 11,445,123 B2 | 9/2022 | Deighton | |
| 11,496,726 B2 | 11/2022 | Deighton | |
| 11,552,061 B2 | 1/2023 | Chae et al. | |
| 11,610,543 B2 | 3/2023 | Thielemans et al. | |
| 11,695,907 B2 | 7/2023 | Steudel et al. | |
| 11,881,151 B2 | 1/2024 | Thielemans et al. | |
| 11,924,560 B2 | 3/2024 | Thielemans et al. | |
| 11,948,501 B2 | 4/2024 | Thielemans et al. | |
| 11,948,506 B2 | 4/2024 | Thielemans et al. | |
| 2002/0163513 A1 | 11/2002 | Tsuji | |
| 2003/0095138 A1 | 5/2003 | Kim et al. | |
| 2003/0128299 A1 | 7/2003 | Coleman et al. | |
| 2003/0133619 A1 | 7/2003 | Wong et al. | |
| 2004/0113875 A1 | 6/2004 | Miller et al. | |
| 2004/0207315 A1 | 10/2004 | Thielemans et al. | |
| 2004/0212582 A1 | 10/2004 | Thielemans et al. | |
| 2004/0233125 A1 | 11/2004 | Tanghe et al. | |
| 2004/0233148 A1 | 11/2004 | Tanghe et al. | |
| 2005/0017922 A1 | 1/2005 | Devos et al. | |
| 2005/0052375 A1 | 3/2005 | Devos et al. | |
| 2005/0116667 A1 | 6/2005 | Mueller et al. | |
| 2005/0122406 A1 | 6/2005 | Voss et al. | |
| 2005/0128751 A1 | 6/2005 | Roberge et al. | |
| 2005/0133761 A1 | 6/2005 | Thielemans | |
| 2005/0134525 A1 | 6/2005 | Tanghe et al. | |
| 2005/0134526 A1 | 6/2005 | Willem et al. | |
| 2005/0213128 A1 | 9/2005 | Imai et al. | |
| 2006/0022914 A1 | 2/2006 | Kimura et al. | |
| 2006/0139238 A1 | 6/2006 | Chiba et al. | |
| 2006/0290614 A1 | 12/2006 | Nathan et al. | |
| 2007/0081357 A1 | 4/2007 | Kim et al. | |
| 2007/0175599 A1* | 8/2007 | Froese | F21S 9/037 160/10 |
| 2007/0241988 A1 | 10/2007 | Zerphy et al. | |
| 2007/0253008 A1 | 11/2007 | Edge et al. | |
| 2007/0263394 A1 | 11/2007 | Thielemans et al. | |
| 2008/0046217 A1 | 2/2008 | Polonskiy et al. | |
| 2008/0079816 A1 | 4/2008 | Yen et al. | |
| 2008/0111773 A1 | 5/2008 | Tsuge | |
| 2008/0165081 A1 | 7/2008 | Lawther et al. | |
| 2008/0285981 A1 | 11/2008 | Diab et al. | |
| 2009/0009103 A1 | 1/2009 | McKechnie et al. | |
| 2009/0066631 A1 | 3/2009 | Lianza | |
| 2009/0102957 A1 | 4/2009 | Phelan | |
| 2009/0103200 A1 | 4/2009 | Feklistov et al. | |
| 2009/0295706 A1 | 12/2009 | Feng | |
| 2010/0001648 A1 | 1/2010 | De Clercq et al. | |
| 2010/0103200 A1 | 4/2010 | Langendijk | |
| 2010/0243025 A1 | 9/2010 | Bhatia et al. | |
| 2010/0289783 A1 | 11/2010 | Leppla | |
| 2010/0302284 A1 | 12/2010 | Karaki | |
| 2010/0309218 A1 | 12/2010 | Suen et al. | |
| 2011/0103013 A1 | 5/2011 | Furukawa | |
| 2011/0121761 A1 | 5/2011 | Zhao | |
| 2011/0126992 A1 | 6/2011 | Yordanova | |
| 2011/0176029 A1 | 7/2011 | Boydston et al. | |
| 2011/0253319 A1* | 10/2011 | Schaupp | E06B 9/42 362/253 |
| 2012/0019633 A1 | 1/2012 | Holley | |
| 2012/0033876 A1 | 2/2012 | Momeyer et al. | |
| 2012/0062622 A1 | 3/2012 | Koyama et al. | |
| 2012/0133837 A1 | 5/2012 | Furukawa | |
| 2012/0287289 A1 | 11/2012 | Steinberg et al. | |
| 2012/0307243 A1 | 12/2012 | Elliott | |
| 2012/0313979 A1 | 12/2012 | Matsuura | |
| 2013/0162696 A1 | 6/2013 | Matsumoto | |
| 2013/0181884 A1 | 7/2013 | Perkins et al. | |
| 2013/0226495 A1 | 8/2013 | Marcu et al. | |
| 2013/0249377 A1 | 9/2013 | Hamer et al. | |
| 2013/0272023 A1 | 10/2013 | Lai | |
| 2014/0002718 A1 | 1/2014 | Spielberg | |
| 2014/0009485 A1 | 1/2014 | Asanuma | |
| 2014/0009505 A1 | 1/2014 | Moon et al. | |
| 2014/0049571 A1 | 2/2014 | Erinjippurath et al. | |
| 2014/0049983 A1 | 2/2014 | Nichol et al. | |
| 2014/0125818 A1 | 5/2014 | Friend | |
| 2015/0070402 A1 | 3/2015 | Shah et al. | |
| 2015/0186097 A1 | 7/2015 | Hall | |
| 2015/0229919 A1 | 8/2015 | Weber et al. | |
| 2015/0339977 A1 | 11/2015 | Nathan et al. | |
| 2015/0348479 A1 | 12/2015 | Kim et al. | |
| 2015/0371405 A1 | 12/2015 | Zhao | |
| 2016/0078802 A1 | 3/2016 | Liang et al. | |
| 2016/0124091 A1 | 5/2016 | Kawahito et al. | |
| 2016/0182790 A1 | 6/2016 | Horesh | |
| 2016/0275835 A1 | 9/2016 | Yuan et al. | |
| 2016/0335958 A1 | 11/2016 | Huang et al. | |
| 2017/0032715 A1 | 2/2017 | Sutherland et al. | |
| 2017/0032742 A1 | 2/2017 | Piper et al. | |
| 2017/0061924 A1 | 3/2017 | Lee et al. | |
| 2017/0069871 A1 | 3/2017 | Yim et al. | |
| 2017/0171492 A1 | 6/2017 | Naito | |
| 2017/0284630 A1 | 10/2017 | Sergenese et al. | |
| 2017/0318178 A1 | 11/2017 | Debevec et al. | |
| 2018/0018793 A1 | 1/2018 | Min et al. | |
| 2018/0060014 A1 | 3/2018 | Son et al. | |
| 2018/0090102 A1 | 3/2018 | Chappalli et al. | |
| 2018/0091860 A1 | 3/2018 | Stokking et al. | |
| 2018/0131160 A1 | 5/2018 | Zhang et al. | |
| 2018/0235052 A1 | 8/2018 | Tada | |
| 2018/0240409 A1 | 8/2018 | Li et al. | |
| 2018/0342224 A1 | 11/2018 | Beon et al. | |
| 2019/0064923 A1 | 2/2019 | Taniguchi | |
| 2019/0080656 A1 | 3/2019 | Herranz et al. | |
| 2019/0098293 A1 | 3/2019 | Lee et al. | |
| 2019/0132560 A1 | 5/2019 | Grosse et al. | |
| 2019/0172404 A1 | 6/2019 | Zhu | |
| 2019/0209858 A1 | 7/2019 | Slaughter et al. | |
| 2019/0212719 A1 | 7/2019 | Ono | |
| 2019/0213951 A1 | 7/2019 | Li et al. | |
| 2019/0244561 A1 | 8/2019 | Zong et al. | |
| 2019/0295457 A1 | 9/2019 | Li et al. | |
| 2019/0306477 A1 | 10/2019 | Nordback | |
| 2019/0356940 A1 | 11/2019 | Mallett | |
| 2019/0364309 A1 | 11/2019 | Von Braun et al. | |
| 2019/0377535 A1 | 12/2019 | Rycyna et al. | |
| 2020/0014904 A1 | 1/2020 | Wetzstein et al. | |
| 2020/0027386 A1 | 1/2020 | Wang et al. | |

(56) References Cited

U.S. PATENT DOCUMENTS

| | | |
|---|---|---|
| 2020/0037011 A1 | 1/2020 | Zong et al. |
| 2020/0043201 A1 | 2/2020 | Tanaka et al. |
| 2020/0098333 A1 | 3/2020 | Marcu |
| 2020/0126501 A1 | 4/2020 | Yamazaki et al. |
| 2020/0160791 A1 | 5/2020 | Chung |
| 2020/0225903 A1 | 7/2020 | Cohen |
| 2020/0280761 A1 | 9/2020 | Staples |
| 2020/0286424 A1 | 9/2020 | Thielemans et al. |
| 2020/0388210 A1 | 12/2020 | Thielemans et al. |
| 2020/0403117 A1 | 12/2020 | Fabien et al. |
| 2021/0005161 A1 | 1/2021 | Lee |
| 2021/0014385 A1 | 1/2021 | Boggavarapu et al. |
| 2021/0056937 A1 | 2/2021 | Sakai |
| 2021/0124174 A1 | 4/2021 | Tokunaga et al. |
| 2021/0125545 A1 | 4/2021 | Sohn et al. |
| 2021/0125570 A1 | 4/2021 | Kang et al. |
| 2021/0185778 A1 | 6/2021 | Otten |
| 2021/0201769 A1 | 7/2021 | Morris et al. |
| 2021/0217157 A1 | 7/2021 | Han et al. |
| 2021/0225267 A1 | 7/2021 | Thielemans et al. |
| 2021/0227270 A1 | 7/2021 | Braun |
| 2021/0266624 A1 | 8/2021 | Zong et al. |
| 2021/0295766 A1 | 9/2021 | Sugiyama et al. |
| 2021/0297717 A1 | 9/2021 | Braun |
| 2021/0306394 A1 | 9/2021 | Zong et al. |
| 2021/0321032 A1 | 10/2021 | Braun |
| 2021/0345058 A1 | 11/2021 | Itakura et al. |
| 2021/0366411 A1 | 11/2021 | Yang et al. |
| 2021/0383842 A1 | 12/2021 | Han et al. |
| 2021/0397398 A1 | 12/2021 | Han et al. |
| 2022/0014728 A1 | 1/2022 | Deighton |
| 2022/0020727 A1 | 1/2022 | Noh et al. |
| 2022/0059045 A1 | 2/2022 | Kobayashi et al. |
| 2022/0059607 A1 | 2/2022 | Murugan et al. |
| 2022/0060612 A1 | 2/2022 | Hochman et al. |
| 2022/0076615 A1 | 3/2022 | Ding et al. |
| 2022/0103738 A1 | 3/2022 | Deighton |
| 2022/0150456 A1 | 5/2022 | Steudel et al. |
| 2022/0191109 A1 | 6/2022 | Chen et al. |
| 2022/0246670 A1 | 8/2022 | Chen et al. |
| 2022/0254317 A1 | 8/2022 | Hochman et al. |
| 2022/0350562 A1 | 11/2022 | Wang et al. |
| 2022/0375387 A1 | 11/2022 | Deighton |
| 2022/0375403 A1 | 11/2022 | Cheng et al. |
| 2022/0413790 A1 | 12/2022 | Cai et al. |
| 2023/0013582 A1 | 1/2023 | Wang et al. |
| 2023/0154399 A1 | 5/2023 | Thielemans et al. |
| 2023/0162400 A1 | 5/2023 | Liu et al. |
| 2023/0162662 A1 | 5/2023 | Zhang et al. |
| 2023/0163142 A1 | 5/2023 | Lu et al. |
| 2023/0186821 A1 | 6/2023 | Hashempour et al. |
| 2023/0209207 A1 | 6/2023 | Hochman et al. |
| 2023/0274693 A1 | 8/2023 | Thielemans et al. |
| 2023/0282153 A1 | 9/2023 | Thielemans et al. |
| 2023/0298503 A1 | 9/2023 | Zhang et al. |
| 2023/0326175 A1 | 10/2023 | Zhang et al. |
| 2024/0022686 A1 | 1/2024 | Thielemans et al. |
| 2024/0044465 A1 | 2/2024 | Thielemans et al. |

FOREIGN PATENT DOCUMENTS

| | | |
|---|---|---|
| BE | 1026226 A1 | 11/2019 |
| CN | 102290003 A | 12/2011 |
| CN | 202249669 U | 5/2012 |
| CN | 102290003 B | 12/2015 |
| CN | 206741357 U | 12/2017 |
| CN | 207352560 U | 5/2018 |
| CN | 110602875 A | 12/2019 |
| CN | 110617000 A | 12/2019 |
| CN | 209875003 U | 12/2019 |
| DE | 102006054856 A1 | 1/2009 |
| EP | 1172783 A1 | 1/2002 |
| EP | 1780798 A1 | 5/2007 |
| EP | 2323072 A1 | 5/2011 |
| EP | 3099058 A1 | 11/2016 |
| EP | 3139422 A2 | 3/2017 |
| FR | 2945072 A1 | 11/2010 |
| GB | 2469819 A | 11/2010 |
| JP | 2001082058 A | 3/2001 |
| JP | 2007062892 A | 3/2007 |
| JP | 2019214445 A | 12/2019 |
| KR | 20170065163 A | 6/2017 |
| TW | 200608327 A | 3/2006 |
| TW | 200608328 A | 3/2006 |
| WO | 2013186278 A1 | 12/2013 |
| WO | 2015114720 A1 | 8/2015 |
| WO | 2018164105 A1 | 9/2018 |
| WO | 2019215219 A1 | 11/2019 |
| WO | 2020253249 A1 | 12/2020 |
| WO | 2021009719 A1 | 1/2021 |
| WO | 2022013191 A1 | 1/2022 |
| WO | 2022064062 A1 | 3/2022 |
| WO | 2022087322 A1 | 4/2022 |

OTHER PUBLICATIONS

Burr, David, "Motion Perception: Human Psychophysics", Apr. 18, 2013, pp. 763-776, MIT Press.
Cast, Inc.,"Understanding—and Reducing—Latency in Video Compression Systems", Oct. 25, 2013, 7 pages, retrieved from <https://web.archive.org/web/20131025202911/https://www.design-reuse.com/articles/33005/understanding-latency-in-video-compression-systems.html>.
Davis et al., "Humans perceive flicker artifacts at 500 Hz", Feb. 3, 2015, 4 pages, Nature, Scientific Reports.
Kang et al., "Nanoimprinted Semitransparent Metal Electrodes and Their Application in Organic Light-Emitting Diodes," May 21, 2007, 6 pages, Advanced Materials.
Larson, Jennifer, "How Many Frames Per Second Can the Human Eye See?", Oct. 20, 2020, 12 pages, retrieved from <https://www.healthline.com/health/human-eye-fps>.
Lee et al., "Solution-Processed Metal Nanowire Mesh Transparent Electrodes", Jan. 12, 2008, pp. 689-692, Nano Letters, vol. 8, No. 2.
Mackin et al., "High Frame Rates and the Visibility of Motion Artifacts", Jun. 30, 2017, 19 pages, SMPTE Motion Imaging Journal, vol. 126, Issue 5.
Thielemans, Robbie, "Displays Applications of LEDs", Handbook of Visual Display Technology, May 21, 2011, 14 pages.
Thielemans, Robbie, "LED Display Applications and Design Considerations", Handbook of Visual Display Technology, May 21, 2011, 5 pages, retrieved from https://link.springer.com/referenceworkentry/10.1007/978-3-540-79567-4_76.
Tobii Connect, "The speed of human visual perception", Sep. 14, 2022, 1 page, retrieved from <https://connect.tobii.com/s/article/the-speed-of-human-perception?language=en_US>.
Wikipedia, "MAC Address", 10 pages, retrieved from <https://en.wikipedia.org/wiki/MAC_address>.
Wilson, Derek, "Exploring Input Lag Inside Out", Jul. 16, 2019, 2 pages, retrieved from <https://www.anandtech.com/show/2803>.
Zhang, Yin, "Performance Characteristics of Lithium Coin Cells for Use in Wireless Sensing Systems", Jun. 17, 2012, 143 pages, All Theses and Dissertations, Brigham Young University.
"The Ins and Outs of HDR—Gamma Curves", Jun. 8, 2020, 3 pages, retrieved from <https://www.eizoglobal.com/library/management/ins-and-outs-of-hdr/index2.html>.
Extended European Search Report from corresponding EP Application No. EP18198749.6, Nov. 12, 2018.
International Search Report and Written Opinion from PCT Application No. PCT/EP2019/061804, Jun. 13, 2019.
Applicant's Amendment/Remarks filed at the EPO on Feb. 20, 2020 for PCT/EP2019/061804.
Applicant's Amendment/Remarks filed at the EPO on May 26, 2020 for PCT/EP2019/061804.
International Preliminary Report on Patentability from PCT/EP2019/061804, Jul. 10, 2020.
Belgian Search Report from BE Application No. 201905196, Aug. 13, 2019.

(56) References Cited

OTHER PUBLICATIONS

Search Report for BE 2019/05759 mailed Jan. 23, 2020, 18 pages.
Belgian Search Report for Belgian Patent Application No. BE2019/5970, Jul. 24, 2020.
Response to Belgian Search Report for Belgian Patent Application No. BE2019/5970, filed by Applicant at the Belgian Patent Office on Nov. 24, 2020.
Belgian Search Report from corresponding Belgian Application No. BE 202205007, Jun. 7, 2022.
Extended European Search Report from corresponding EP Application No. 22185014.2, Dec. 8, 2022.
Office Action from European Application No. 19722133.6, Jan. 19, 2023.
Extended European Search Report from Corresponding European Patent Application No. EP23190432.7, Feb. 12, 2024.
Belgian Search Report from Belgian Patent Application No. BE202305595, Nov. 21, 2023.
Response to Belgian Search Report from Belgian Patent Application No. BE2023/5595, filed Mar. 21, 2024.
Extended European Search Report from European Patent Application No. EP23185674.1, Nov. 16, 2023.
Partial European Search Report from European Patent Application No. EP23198096, Nov. 29, 2023.
Extended European Search Report from European Patent Application No. EP23198096.2, Apr. 9, 2024.
Extended European Search Report from European Patent Application No. EP23190432.7, Feb. 12, 2024.
Extended European Search Report from European Patent Application No. EP23160521, Jul. 6, 2023.
Response to Extended European Search Report from European Patent Application No. EP23160521, dated Jan. 29, 2024.
Extended European Search Report from European Patent Application No. EP23218322.8, Mar. 27, 2024.
Extended European Search Report from European Patent Application No. EP23218336.8, Apr. 10, 2024.
Partial European Search Report from European Patent Application No. EP23218348.3, Apr. 30, 2024.
Extended European Search Report from European Patent Application No. EP23218353.3, Mar. 26, 2024.
Extended European Search Report from European Patent Application No. EP23218356.6, Apr. 5, 2024.
Extended European Search Report from European Patent Application No. EP23218377.2, Apr. 24, 2024.
Belgian Search Report from Corresponding Belgian Patent Application No. BE202305665, Apr. 29, 2024.

* cited by examiner

PHOTOVOLTAIC SUNSHADE AND DISPLAY SYSTEM

TECHNICAL FIELD

The invention relates to an at least partially self-powered photovoltaic sunshade or curtain having a display system incorporated. With the photovoltaic means, solar energy can be captured and stored during the day, whereas this energy stored (e.g. in a battery) can be used in the evening or night to actuate the display, for example herewith lightening up a LED screen.

BACKGROUND OF THE INVENTION

Solar photovoltaic blinds and curtains enabling energy production are known in the art. Moreover, covering arrangements for doors, windows or the like with photovoltaic cells or a photovoltaic layer having a storage means connected, exist already for a few decades.

Examples can also be mentioned of displays, be it for example LED or LCD, provided with photovoltaic cells or solar panels.

An additional challenge is faced whenever one wants to combine a photovoltaic sunscreen with a display system.

SUMMARY OF THE INVENTION

The aim of the invention is to provide a photovoltaic sunshade charging electricity during the day, and having a display system incorporated using the charged electricity during the evening or night for displaying images on the display system. Herewith, the aim is also to provide a balanced at least partially self-powered system such that high quality images are shown all evening or night without draining the system to zero or the system going down. The sunshade may be of the type comprising of blinds, whereas such sun-blinds may comprise of a plurality of so-called slats. According to an embodiment, each of the slats have two sides, i.e. one side provided with photovoltaic (PV) functionality (e.g. comprising PV cells or a PV layer), and another side provided with display (or lighting) functionality, for example with light-emitting display functionality (e.g. comprising LEDs). The basic functionality of a LED is quite similar to that of a photovoltaic cell. In other words, a an LED can also act as a PV cell, but for clarity reasons, a distinction is made between both functionalities, meaning that either the display function, or else the PV function is on or activated.

According to a first aspect of the invention, an at least partially self-powered photovoltaic sunshade and display system is provided, comprising a plurality of panels arranged in an array e.g. next to each other. We may further refer to this array as panel array. With photovoltaic sunshade is meant a sunshade or sunscreen (or just a screen as such) comprising photovoltaic means for energy harvesting. The display system comprises for example a light-emitting display such as a LED screen. With at least partially self-powered is meant that it is at least partially autonomous in generating power, storing this generated power in some way e.g. by charging a battery, and using it for electrification purposes such as for example powering a light-emitting display integrated in the display system. In other words, it is possible that there is still an electrical connection with the net or an external power supply for powering the system (at least partially), which may be useful for example when there is a succession of too many days with little sun, and hence little energy harvesting possible with the photovoltaic means. According to an embodiment, the system is only self-powered and thus fully autonomous. Each of the plurality of panels has two sides. In particular, each panel has a first side onto which a plurality of photovoltaic cells or a photovoltaic layer including (local) energy storage means (such as a battery) is provided, and each panel has a second side onto which an array (other than the panel array) or grid of light-emitting elements, e.g. LEDs (including one or more light-emitting element or LED drivers) is provided. Each panel can be seen as standalone, for example, as described in the 'STANDALONE LIGHT-EMITTING ELEMENT DISPLAY TILE AND METHOD' of US patent application US2021/0225267 from the same applicant, which is herein incorporated by reference, but having a display side and a PV side. Although the panels rather acting as standalone, they can be connected with each other, such that one panel (having sufficient energy) may deliver energy to another one (lacking energy). Moreover, each panel is rotatable about an axis, for rotating the sides towards or away from the sun typically during the day, or towards or away from the exterior environment typically during evening or night (although it could be for instance in case of dark cloudy days that this is also applicable during the day). With exterior environment is meant the outside of the room, window, or for example building wherein the system is provided. According to an embodiment, the entire panel array comprising of multiple panels, is rotatable about an axis.

The plurality of panels can be arranged in a 1D-array herewith forming a (horizontal) row or a (vertical) column of panels. The plurality of panels can also be arranged in a 2D-array or so-called matrix comprising of at least two (horizontal) rows or at least two (vertical) columns of panels. According to an embodiment, the panels are elongated rectangularly shaped slats (as we typically see for example in sunshade systems provided onto windows in e.g. office or home environments), which can be arranged as horizontal strips, i.e. the slats having their lengths parallel with the ground floor, stacked on top of each other. They can also be arranged as vertical strips, i.e. the slats having their lengths perpendicular to the ground floor, packed next to each other. The edges (or part thereof) of the of panels can also be provided with light-emitting elements such as LEDs.

According to an embodiment, the at least partially self-powered photovoltaic sunshade and display system further comprises a motor for rotating the sides. Whereas the energy stored may be used for powering such motor, the at least partially self-powered system may overcome temporality sun shading. According to an embodiment, a plurality of motors is provided. In addition, the at least partially self-powered photovoltaic sunshade and display system may further comprise a (local) control and (light) sensor for automatically rotating the sides of the panels depending on the light incidence.

In a second aspect of the invention, the use is provided of the at least partially self-powered photovoltaic sunshade and display system in accordance with the first aspect. Such use comprises the ability of (i) during the day, positioning the plurality of panels with their first side rotated towards the sun, herewith capturing energy and charging each of the panels' (local) storage means, and (ii) during evening or night, positioning the plurality of panels with their second side rotated towards the exterior environment, herewith using the charged (local) storage means for lighting purposes or for displaying images by means of the array (grid) of light-emitting elements. Depending on the energy stored, it can be calculated how the available power should be used during the evening and night (in a balanced way), such that the lighting or display doesn't go down. The energy stored per panel may differ, meaning that for example one panel received less sun because a person was standing in front thereof, herewith blocking the sun. According to an embodiment, the local energies could be averaged by means of transferring/dividing energy amongst the panels. In case one or more motors are provided for rotating the sides of the panels, these are probably using most energy. Consider the situation that not that much sun has been present, and hence not that much energy is captured and stored, then it might be interesting to reserve the available energy or power at least for rotating the sides of the panels, and maybe do this rotating or positioning (long) before the sun is gone. The system could also be provided with intelligence (e.g. machine learning) and not only rotate the panels or change position thereof because of day/night or all or not having sun, but also for example do the rotating or positioning of panels depending on the audience present, their mood and/or their habits. According to a particular embodiment, a method of self-powering a photovoltaic sunshade and display system, comprises (i) during the day, positioning the plurality of panels with their first side rotated towards the sun and capturing energy and charging each of the panels' storage means, for example, as a local storage means, and (ii) simultaneously during the day, having the plurality of panels positioned with their second side rotated towards an inner environment of e.g. a building, using the charged (e.g., local) storage means for lighting purposes or for displaying images by means of the array (grid) of light-emitting elements in the inner environment.

According to third aspect of the invention, an at least partially self-powered photovoltaic sunshade and display system is provided, comprising a covering (PCB) board having two sides, meaning an interior and an exterior side, facing the interior and the exterior environment respectively. The covering board refers to the fact that the board (e.g. comprising of an array of panels) is for example provided onto a window or (transparent) door in a home or office environment, herewith covering the window or (transparent) door and sheltering the interior from sun and/or light because of the photovoltaic sunshade functionality being part of the board. The system also comprises an arrangement of a plurality of photovoltaic cells on the exterior side of the board and a storage means connected therewith, and an arrangement of a plurality of light-emitting elements (e.g. LEDs) on the interior side of the board. Further, the system comprises a plurality of light-emitting element drivers on the board for each of the plurality of light-emitting elements, or a light-emitting element driver (e.g. LED driver) for the plurality of light-emitting elements on the board or on a separate (PCB) driver board. In addition, the system comprises one or more sensors of which at least a light sensor on the exterior side of said board or an IR sensor on said board. The covering board can be flexible and/or stretchable. The covering board may comprise of a plurality of panels arranged in an array (next to each other). Whenever the covering board is flexible and/or stretchable, it can be rolled up (for not use) or unrolled (for use).

In a fourth aspect of the invention, a carport is provided, comprising the at least partially self-powered photovoltaic sunshade and display system in accordance with the third aspect.

According to a fifth aspect, an at least partially self-powered photovoltaic sunshade and display system is provided, comprising a covering (PCB) board having two sides, an interior and an exterior side, again an interior and an exterior side, facing the interior and the exterior environment respectively. The system again comprises an arrangement of a plurality of light-emitting elements (e.g. LEDs) on the exterior side of the board, however now, an arrangement of a plurality of photovoltaic cells is provided on the exterior side of the board, possibly mounted alternatingly in between said light-emitting elements. A storage means is connected with the photovoltaic cells. The system also comprises a plurality of light-emitting element drivers on the board for each of the plurality of light-emitting elements, or a light-emitting element driver (e.g. LED driver) for the plurality of light-emitting elements on the board or on a separate (PCB) driver board. In addition, the system comprises one or more sensors of which at least a light sensor or an IR sensor on the exterior side of said board. Also here, the covering board can be flexible and/or stretchable. And again, the covering board may comprise of a plurality of panels arranged in an array (next to each other). Whenever the covering board is flexible and/or stretchable, it can be rolled up (for not use) or unrolled (for use).

In summary, a sunshade is provided. The sunshade has a display function (comprising, e.g., LEDs), which may be provided with local control (e.g. comprising one or more sensors), and possibly one or more batteries. The sunshade may have a photovoltaic element, and may be provided with actuators for rotation, e.g., configured to rotate the sunshade (panels) for display or photovoltaic activation.

DETAILED DESCRIPTION OF THE INVENTION

This present invention relates to a self-powered, at least partially, photovoltaic sunshade or sunscreen and a display, incorporated together into one single system. The photovoltaic sunshade or sunscreen may comprise of multiple photovoltaic elements or just one (large) photovoltaic layer, covering one side of a sheet or panel. The other side of the sheet or panel is provided with a display, typically a light-emitting display such as a LED screen. The sheet or panel thus having two sides, meaning a first photovoltaic sunscreen side, comprising for example of a plurality of solar cells facing the sun i.e. the exterior of the room wherein the system is provided during the day, and a second opposite display side facing the interior of the room during the day. The sheet or panel can be rotated, such that the side facing the exterior or interior can be changed. As a result, the display side will be typically facing the exterior of the room during the evening or night for lighting, media or entertainment purposes, when the sun is gone and hence the sunscreen application is no longer of use.

Whereas the photovoltaic side of the sheet or panel is enabled and meant for capturing solar energy, typically during the day, and also storing it by providing (local) energy storage means such as a battery, the display can be actuated or used in the evening or night with the energy pre-captured and pre-stored. By means of example, one or more batteries could be provided onto or with the sheet or panel for (locally) storing the captured energy. In other words, the photovoltaic sunshade is storing electricity during the day, using energy storage means such as for example (one or more) batteries. Later on, in the evening or night, when the sun has gone down or maybe also when it's getting dark, the stored electricity (as generated by the solar modules or photovoltaic elements) can be used by discharging the (one or more) batteries. With the stored electricity, the display for example comprising of a LED array can be actuated, herewith displaying images or video during the evening or night, or possibly also during the day when it's getting dark or cloudy.

The invention is now further described by means of different embodiments, for which is also referred to FIG. 1a to 7.

Figure 1A:
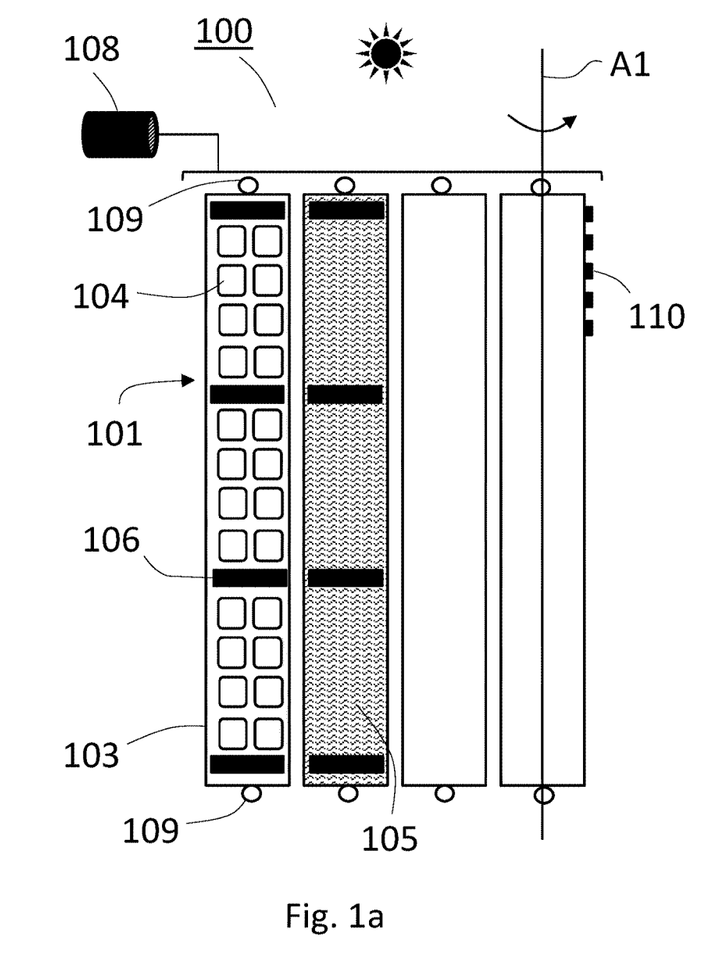
FIGS. 1a and 1b illustrate embodiments of an at least partially self-powered photovoltaic sunshade and display system with vertical set-up, in accordance with the invention.
Figure 1B:
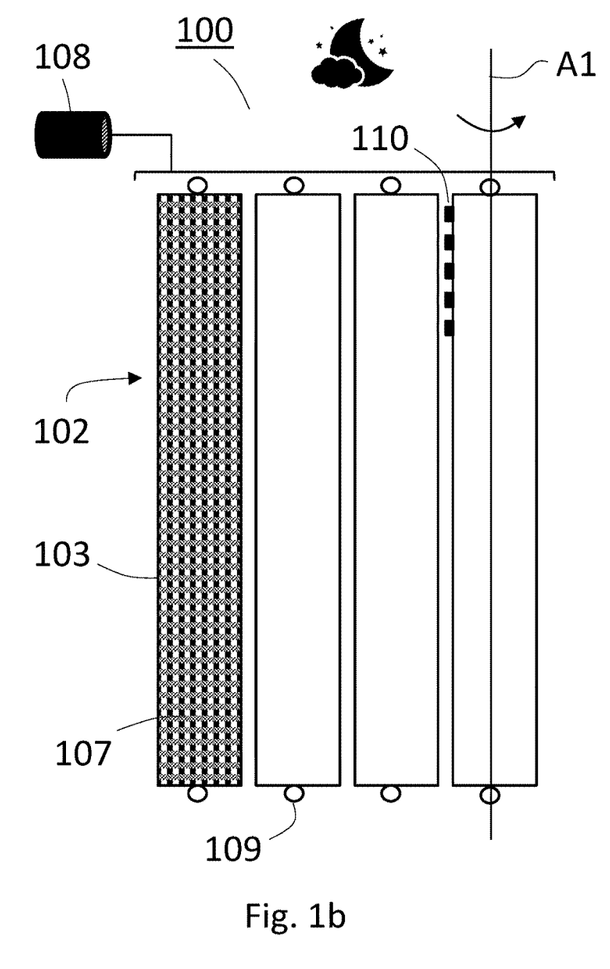

FIGS. 1(a) and 1(b) illustrate an embodiment of an at least partially self-powered photovoltaic sunshade and display system 100, in accordance with the invention. The system 100 comprises a plurality of panels 103 arranged in an array, here an array of 1×4 (1 row, 4 columns) is presented. Here, the panels 103 are elongated rectangularly shaped slats, as we know for example from sunshade systems provided onto windows in e.g. office or home environments. According to the embodiment, the slats are arranged as vertical strips packed next to each other, or in other words, the slats are positioned with their lengths perpendicular to the ground floor. Each panel 103 has two sides 101, 102. The system 100 with detail of the panels' first side 101 is shown in FIG. 1(a), whereas FIG. 1(b) illustrates the panels' second side 102. As depicted in FIG. 1(a), the first side 101 of the panels 103 is provided with a plurality of photovoltaic cells 104 or with a photovoltaic layer 105, for example covering the entire panel 103. This first side 101 is typically to be used during the day, when the sun is shining. A sun icon is therefore depicted here. In general, the system 100 will either have panels 103 with photovoltaic cells 104 or will comprise panels 103 provided with a photovoltaic layer 105. It could be however, that a mixture of panels 103 having photovoltaic cells 104 and/or photovoltaic layer 105 is provided by the system 100. Onto the panels' first side 101, energy storage means 106, e.g. one or more batteries, are also provided. As illustrated in FIG. 1(b), the second side 102 of the panels 103 comprise an array or grid of light-emitting elements 107 such as for example LEDs. This second side 102 is typically to be used during the evening or night, when the sun has gone down. A night icon with moon and stars is therefore depicted here. Each panel 103 is rotatable about an axis A1, for rotating the sides 101, 102 (left or right) towards or away from the sun, or towards or away from the exterior environment i.e. to the outside of the room, building or environment wherein the system 100 is provided. The rotation (direction) is indicated by means of the arrow around axis A1.

Further is depicted, in both FIGS. 1(a) and 1(b), that the edges of the of panels 103 can also be provided with light-emitting elements 110 or LEDs. We can refer to this type of LEDs as edge LEDs 110, whereas the other LEDs provided onto the second side surface could be referred to as surface LEDs 107. This may give an extra lighting effect, the moment the sun goes down, or it's getting dark, and the panels 103 are turned or rotated such that their display side 102 is put in place or position to face the exterior environment, and start showing images, video or lighting effects e.g. along or towards the street where the home or building provided with the system 100 is located. According to the embodiment, the system 100 comprises a motor 108 for rotating the panel sides 101, 102. The motor can be powered by means of the energy storage means 106 provided in the system 100. It is however possible, that the motor 108 is still also connected to the net, in case additional power would be needed, for example because there is not enough available from storage e.g. due to cloudy or dark days of less or little sun. The system 100 may also comprise a control (module) and one or more sensors 109 (e.g. provided onto or in the vicinity of the panels 103) for automatically rotating the sides 101, 102 of the panels 103 depending on the light (or sun) incidence.

Figure 2A:
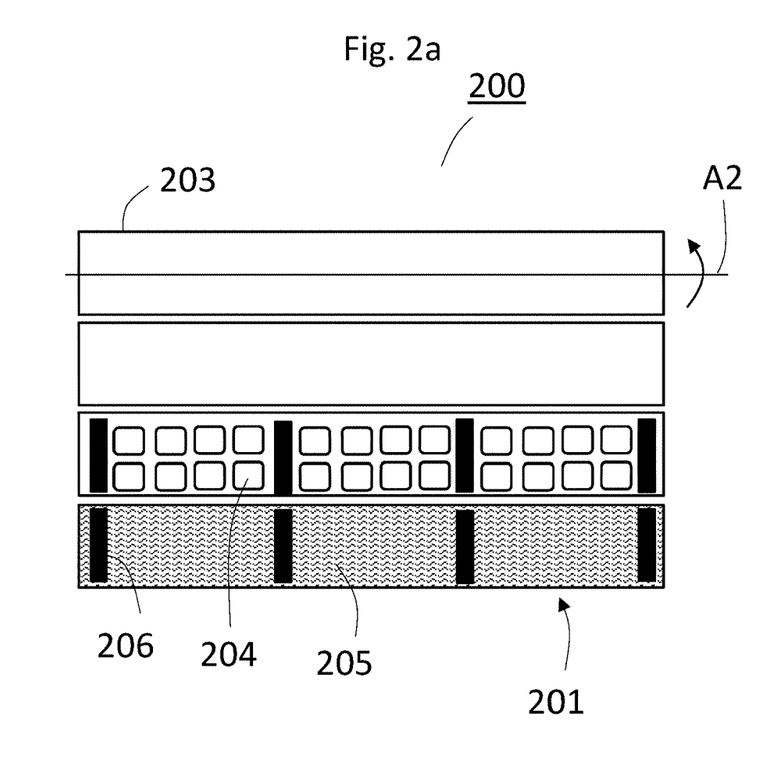
FIGS. 2a and 2b illustrate embodiments of an at least partially self-powered photovoltaic sunshade and display system with horizontal set-up, in accordance with the invention.
Figure 2B:
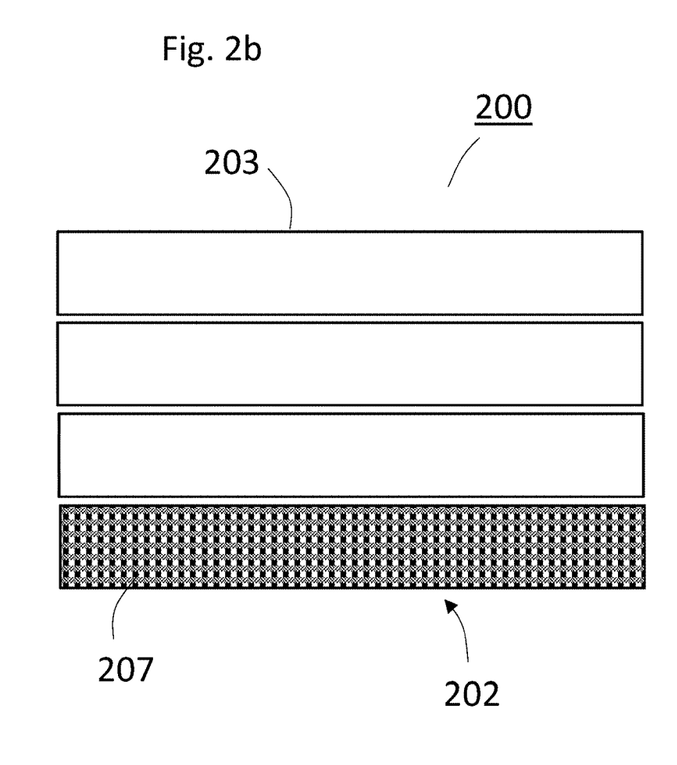

FIGS. 2(a) and 2(b) illustrate another embodiment of an at least partially self-powered photovoltaic sunshade and display system 200, in accordance with the invention. The system 200 again comprises a plurality of panels 203 arranged in an array, now an array of 4×1 (4 rows, 1 column) is given. As in previous FIGS. 1(a) and 1(b), the panels 203 are elongated rectangularly shaped slats, though now positioned differently, i.e. with their lengths parallel to the ground floor, instead of perpendicular therewith. According to the embodiment, the slats are arranged as horizontal strips stacked on top of each other. Each panel 203 has again two sides 201, 202. The panels' first side 201 is shown in FIG. 2(a), whereas FIG. 2(b) illustrates the panels' second side 202. As depicted in FIG. 2(a), the first side 201 of the panels 203 is provided with a plurality of photovoltaic cells 204 or with a photovoltaic layer 205, for example covering the entire panel 203. Onto the panels' first side 201, energy storage means 206, e.g. one or more batteries, are also provided. As illustrated in FIG. 2(b), the second side 202 of the panels 203 comprise an array or grid of light-emitting elements 207 such as for example LEDs. Each panel 203 is rotatable about an axis A2, for rotating the sides 201, 202 (up or down) towards or away from the sun, or towards or away from the exterior environment i.e. to the outside of the room, building or environment wherein the system 200 is provided. The rotation (direction) is indicated by means of the arrow around axis A2.

Figure 3A:
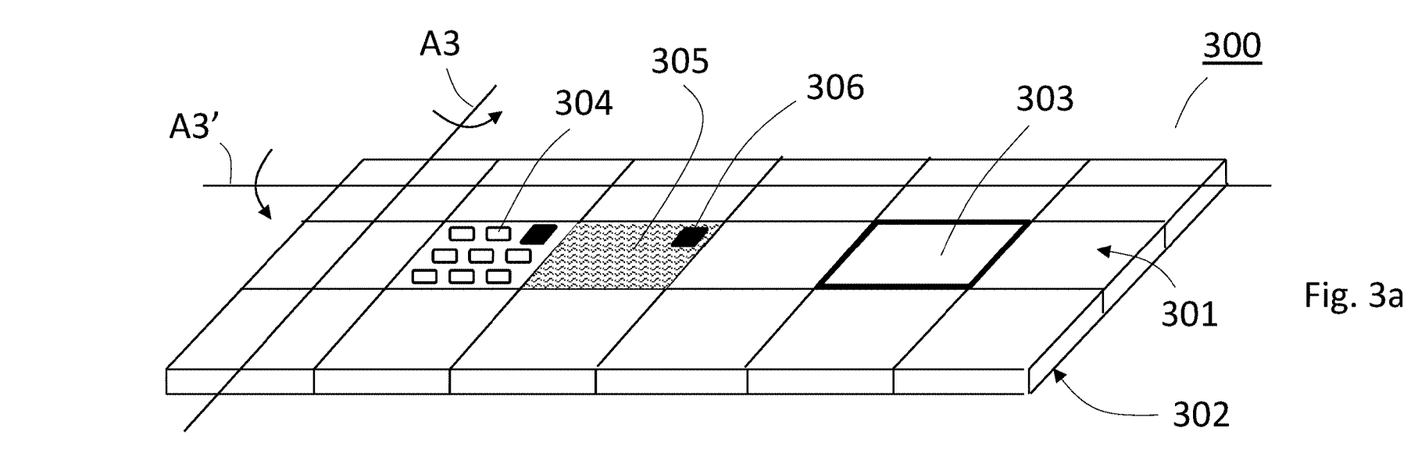
FIGS. 3a and 3b illustrate embodiments of an at least partially self-powered photovoltaic sunshade and display system with matrix set-up, in accordance with the invention.
Figure 3B:
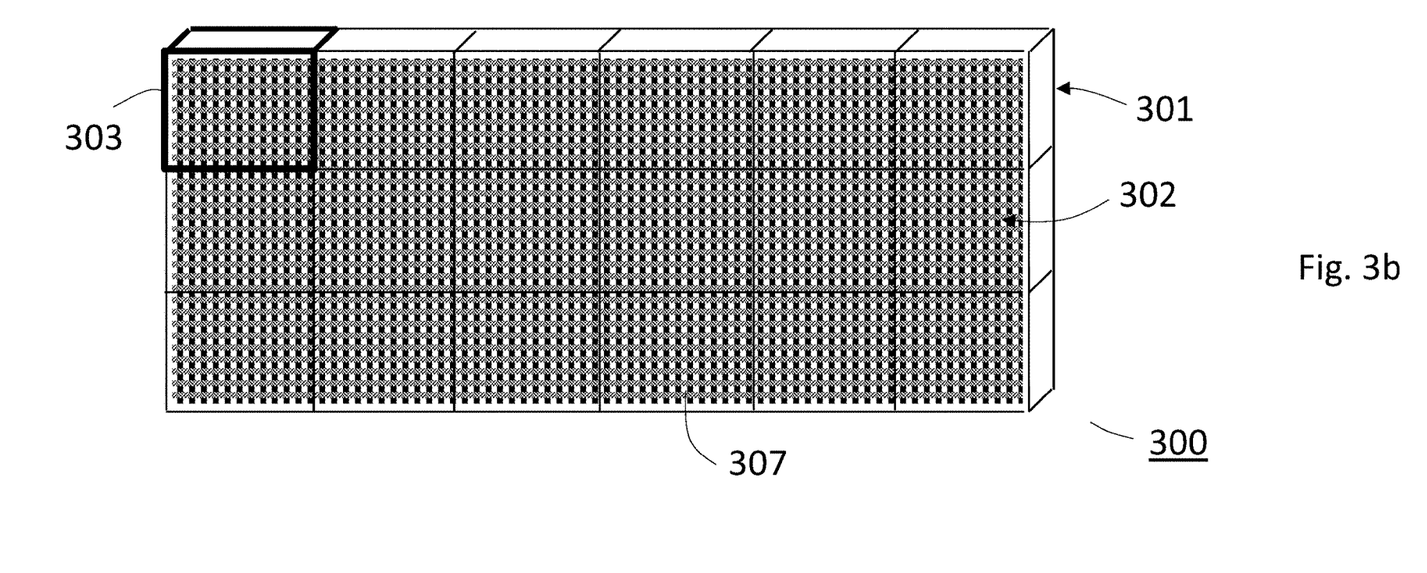

FIGS. 3(a) and 3(b) illustrate a further embodiment of an at least partially self-powered photovoltaic sunshade and display system 300, in accordance with the invention. The system 300 now comprises a plurality of panels 303 arranged in an array of 3×6 (3 rows, 6 columns). The panels 303 are thus arranged in a 2D-array comprising of three rows and six columns of panels 303. The panels 303 appear here as square or rectangular shaped, each having two sides 301, 302. The panels' first side 301 is shown in FIG. 3(a), whereas FIG. 3(b) illustrates the panels' second side 302. As depicted in FIG. 3(a), the first side 301 of the panels 303 is provided with a plurality of photovoltaic cells 304 or with a photovoltaic layer 305, for example covering the entire panel 303. Onto the panels' first side 301, energy storage means 306, e.g. one or more batteries, are also provided. Possibly, there is one battery 306 per panel 303 as depicted here. As illustrated in FIG. 3(b), the second side 302 of the panels 303 comprise an array or grid of light-emitting elements 307 such as for example LEDs. Each panel 303 is rotatable about a (vertical) axis A3, for rotating the sides 301, 302 (left or right) towards or away from the sun, or towards or away from the exterior environment i.e. to the outside of the room, building or environment wherein the system 300 is provided. Possibly, as illustrated here, each panel 303 is also rotatable about a (horizontal) axis A3', for rotating the sides 301, 302 (up or down) towards or away from the sun, or towards or away from the exterior environment. Whereas the panels' axes A3, A3' of rotation are coinciding respectively per column or per row, one could say that an entire panel column or row is rotatable about the axis A3, A3' respectively.

Figure 4A:
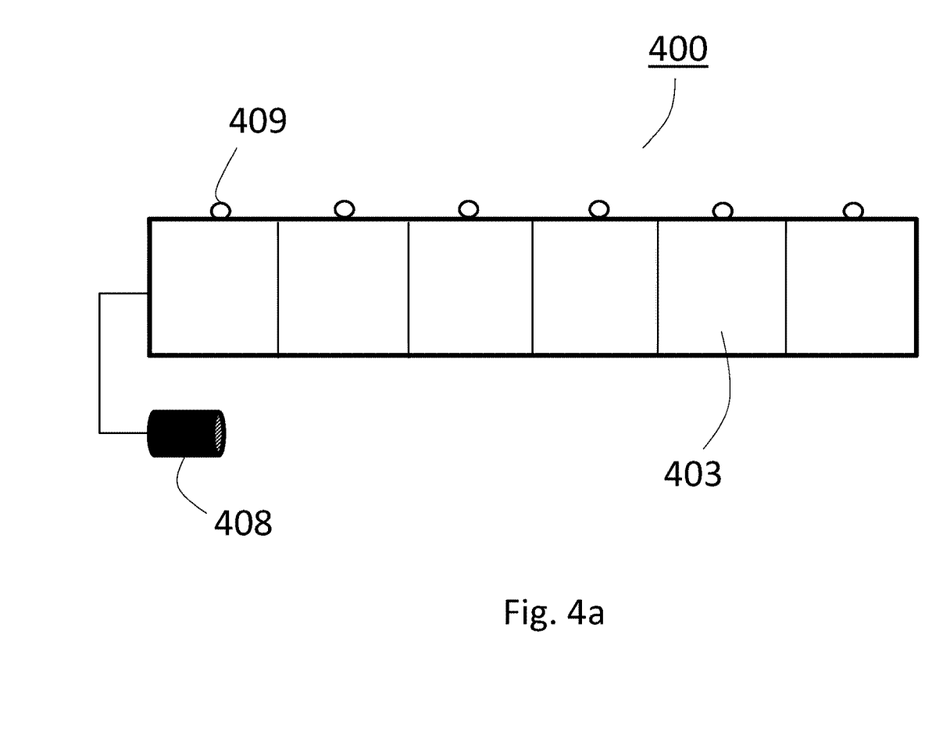
FIGS. 4a and 4b illustrate embodiments of an at least partially self-powered photovoltaic sunshade and display system in row or column representation, in accordance with the invention.
Figure 4B:
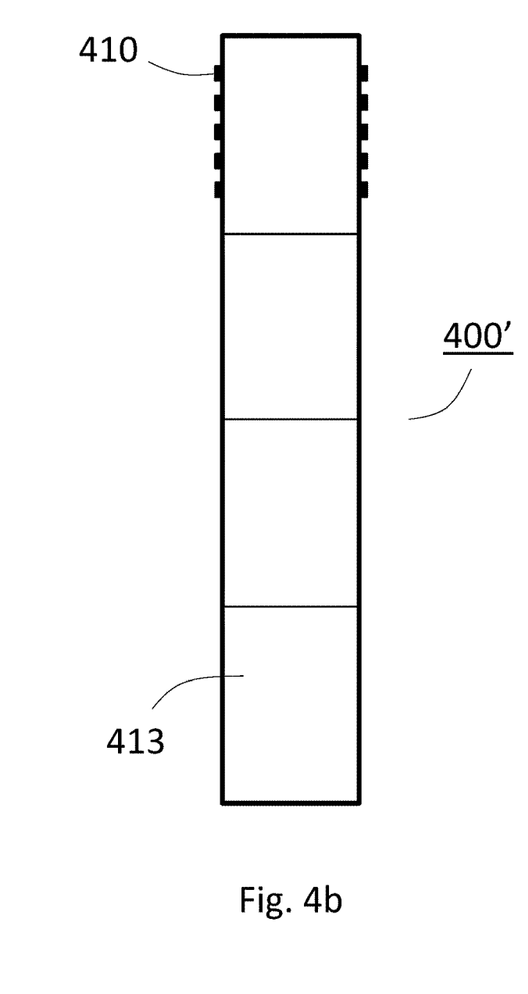

FIGS. 4(a) and 4(b) illustrate yet further embodiment of an at least partially self-powered photovoltaic sunshade and display system 400, 400', in accordance with the invention. The system 400 in FIG. 4(a) comprises a 1D-array or single (horizontal) row of panels 403, here six in total. The system 400 is provided with a motor 408 for rotating the panels 403 from one side 401 (e.g. photovoltaic side) to the other 402 (e.g. display side). The system 400 also comprises sensors 409, for example in the vicinity of e.g. above (as depicted here) or below the panels 403. An alternative column system 400' is depicted in FIG. 4(b), comprising a 1D-array or single (vertical) column of panels 413, here four in total, wherein edge LEDs 410 are indicated.

Figure 5A:
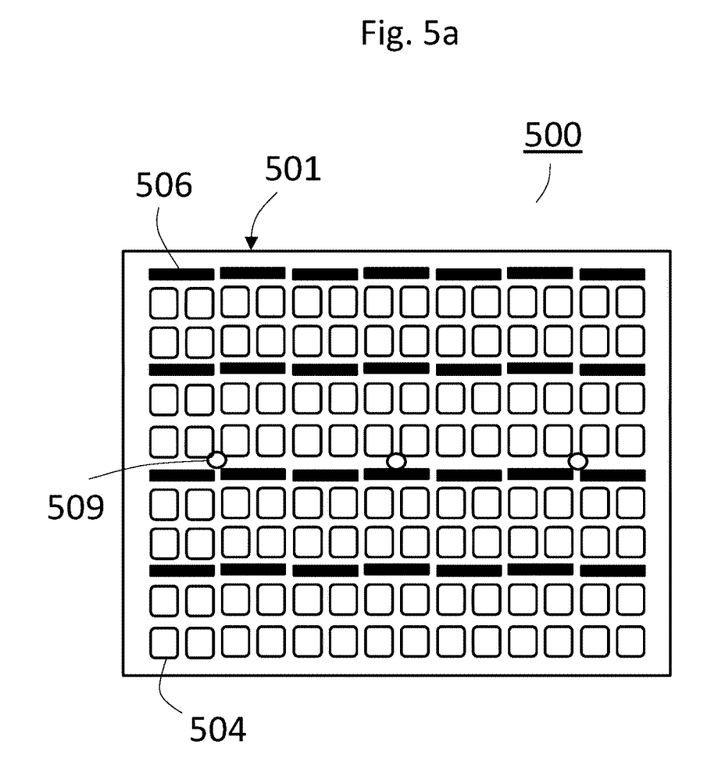
FIGS. 5a and 5b illustrate embodiments of a double-sided PCB board for an at least partially self-powered photovoltaic sunshade and display system, in accordance with the invention.
Figure 5B:
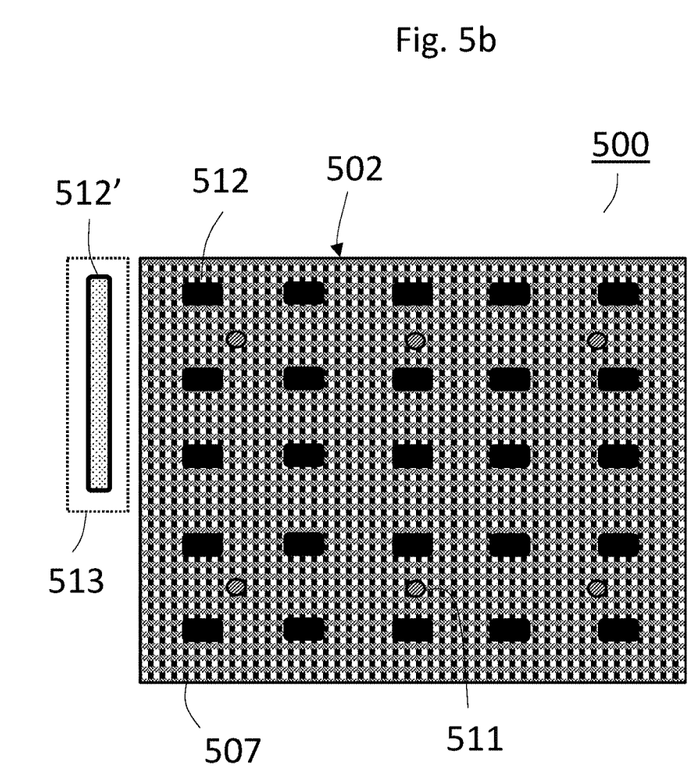

FIGS. 5(a) and 5(b) illustrate an embodiment of a PCB board 500 that is double-side mounted for an at least partially self-powered photovoltaic sunshade and display system with, in accordance with the invention. With double-side mounted is meant that components such as photovoltaic cells 504 and LEDs 507 are mounted on both sides 501, 502 of the PCB board 500. The PCB board 500 can be seen as the foundation for the sheet or panel (as discussed above) being the basis for the sunshade and display system, and of which a plurality can be provided for the design or configuration of such system. The PCB board 500, having a first exterior side 501 shown in FIG. 5(a), and a second interior side 502 shown in FIG. 5(b), is provided with components at both sides 501, 502. In particular, onto the first exterior side 501, photovoltaic cells 504 and therewith connected storage means 506 (for example one or more batteries) are mounted, whereas onto the second interior side 502, light-emitting elements such as LEDs 507 are mounted, including one or more drivers 512 for these light-emitting elements or LEDs 507. The one or more drivers 512 can also be mounted onto the second interior side 502 of the PCB board 500, or alternatively, one LED driver 512' is e.g. mounted onto a separated board 513 next to or in the vicinity of the PCB board 500 (as depicted in/with dots). More specifically, according to an embodiment, there is one LED driver 512 foreseen onto the PCB board 500 for each individual LED 507, hence we have a plurality of LED drivers 512 for a plurality of LEDs 507 correspondingly. In another embodiment, there is one LED driver 512 foreseen onto the PCB board 500 or onto another separate board 513, next thereto or in the vicinity thereof, for the plurality of LEDs on the PCB board 500, or for part of this plurality (e.g. one LED driver per 12 LEDs). The PCB board 500 may further comprise one or more sensors 509, 511 of which for example a light sensor 509 on the first exterior side 501 and an infrared sensor 511 on the second interior side 502 are here depicted. The PCB board 500 can be flexible and/or stretchable, and may comprise of a plurality of panels arranged in an array. Optionally, the flexible and/or stretchable board 500 can be rolled up (for not use) or unrolled (for use).

Figure 6:
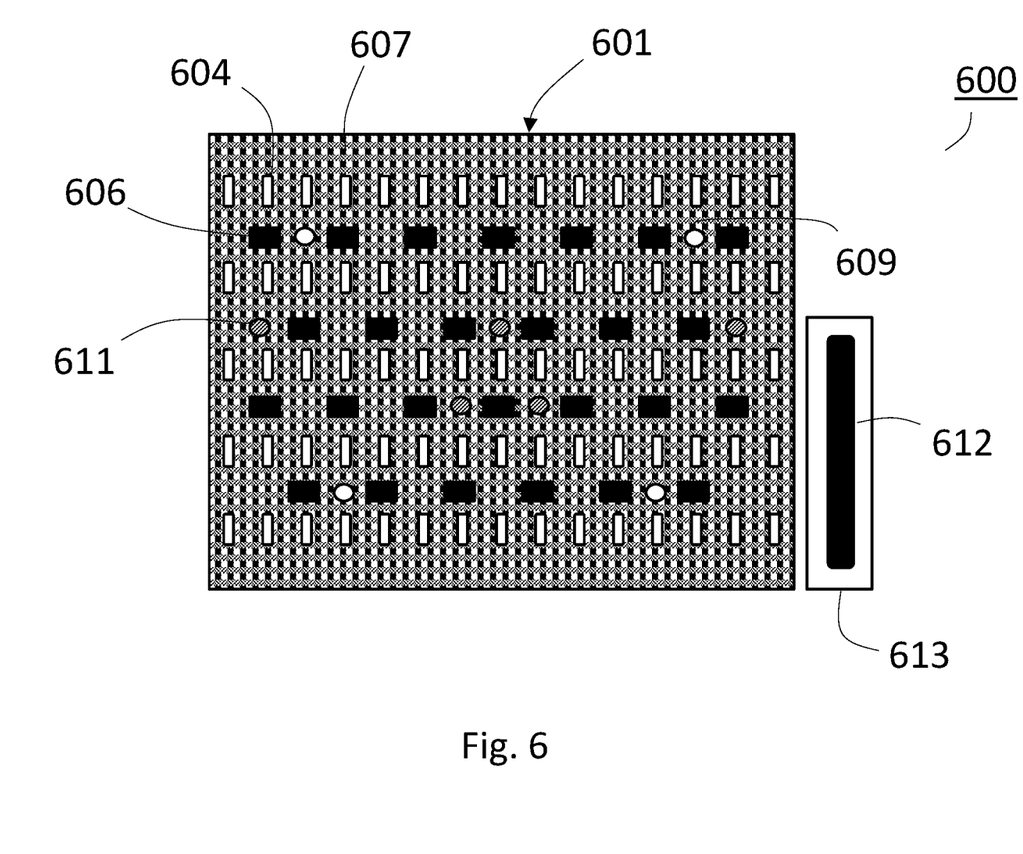
FIG. 6 illustrates an embodiment of single-sided PCB board for an at least partially self-powered photovoltaic sunshade and display system, in accordance with the invention.

FIG. 6 illustrates an embodiment of a PCB board 600 single-side mounted for an at least partially self-powered photovoltaic sunshade and display system, in accordance with the invention. With single-side mounted is meant that components are mounted on just one side 601 of the PCB board 600. The PCB board 600 having a first exterior side 601 and a second interior side 602 (not indicated), is provided with components only at the first exterior side 601. In particular, onto this side 601, photovoltaic cells 604 and therewith connected storage means 606 (for example one or more batteries) are mounted, as well as light-emitting elements such as LEDs 607, including one or more drivers 612 for these light-emitting elements or LEDs 607. Alternatively, as shown here, one LED driver 612 is mounted onto a separated board 613 next to or in the vicinity of the PCB board 600. The PCB board 600 may again comprise one or more sensors 609, 611, here for example a light sensor 609 and an infrared sensor 611 both mounted on the first exterior side 601. The PCB board 600 can be flexible and/or stretchable, and may comprise of a plurality of panels arranged in an array. Optionally, the flexible and/or stretchable board 600 can be rolled up (for not use) or unrolled (for use).

Figure 7:
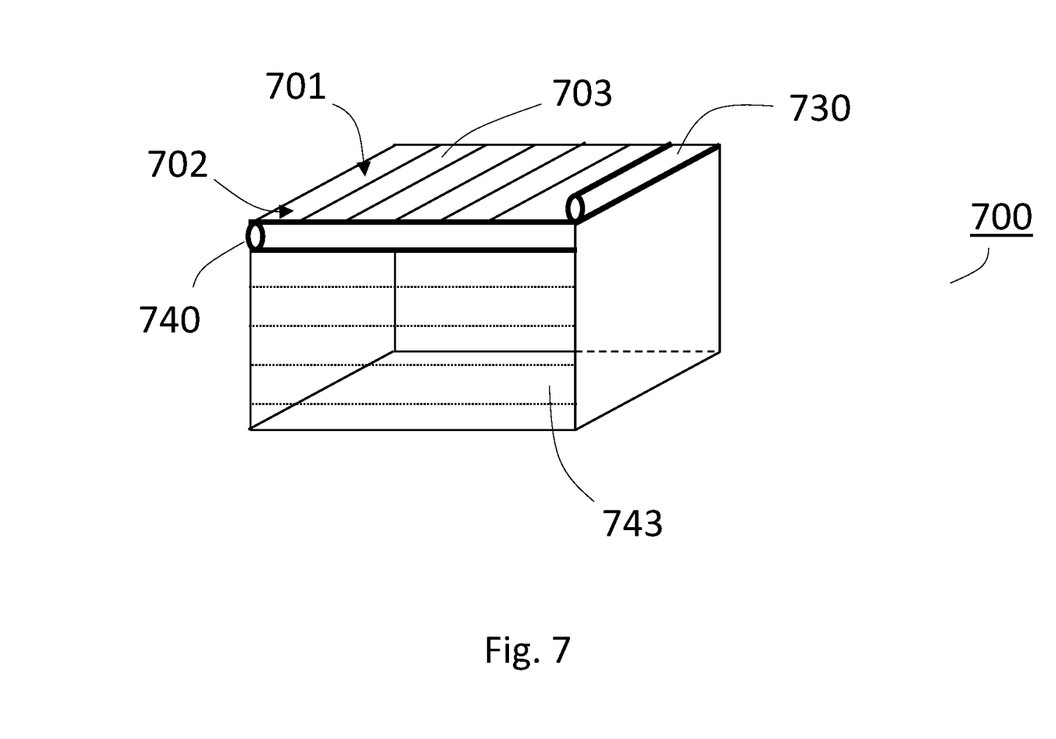
FIG. 7 illustrates an embodiment of a carport having an at least partially self-powered photovoltaic sunshade and display system, in accordance with the invention.

FIG. 7 illustrates an embodiment of a carport 700 comprising an at least partially self-powered photovoltaic sunshade and display system 720, in accordance with the invention. Here, the sunshade and display system 720 is provided with a covering (PCB) board having two sides 701, 702, an exterior side 701 and an interior side 702. The board is flexible and/or stretchable and can be horizontally (parallel to the ground floor) rolled up (for not use) or unrolled (for use) by means of a (all or not motorized) roll 730. In addition, the board comprises of a plurality of panels 703 arranged in an array. Onto the exterior side 701 of the board, an arrangement of a plurality of photovoltaic cells is provided including storage means connected therewith. The interior side 702 of the board comprises an arrangement of a plurality of light-emitting elements such as LEDs, as well as one or more light-emitting element or LED drivers for the light-emitting elements or LEDs, wherein the one or more drivers are either also mounted onto the board, or else provided onto a separate driver board e.g. next to or in the vicinity of the covering board. Onto the exterior side 701 of the board, for example a light sensor is also provided, whereas the board may further comprise (e.g. on the interior side 702) one or more infrared sensors. According to an embodiment, the at least partially self-powered photovoltaic sunshade and display system 720 could be further extended with another roll 740 for rolling up and unrolling vertically (perpendicular to the ground floor) another flexible and/or stretchable board comprising of panels 743 (dotted representation), herewith possibly entirely closing the carport, before or after a car is driving in. In another embodiment, the at least partially self-powered photovoltaic sunshade and display system is fixed onto the carport roof, and hence not rollable or unrollable. In this case, the system could be provided with a plurality of panels, each having two sides, and being rotatable about an axis, for rotating their sides towards or away from the sun, or towards or away from the exterior or interior environment.

Combinability of Embodiments and Features

This disclosure provides various examples, embodiments, and features which, unless expressly stated or which would be mutually exclusive, should be understood to be combinable with other examples, embodiments, or features described herein.

In addition to the above, further embodiments and examples include the following:

1. An at least partially self-powered photovoltaic sunshade and display system, comprising a plurality of panels arranged in an array,
    wherein each of the plurality of panels has two sides, including
        a first side including a plurality of photovoltaic cells or a photovoltaic layer, and
        a second side including an array of light-emitting elements;
    wherein the at least partially self-powered photovoltaic sunshade and display system further comprises energy storage means that receives charge from the plurality of panels and provides electrical power to the array of light-emitting elements; and
    wherein each of the plurality of panels is rotatable about an axis such that the two sides are respectively rotatable towards or away from the sun, and towards or away from an exterior environment.

2. The at least partially self-powered photovoltaic sunshade and display system of any or a combination of 1 above and 3-12 below, wherein the plurality of panels are arranged in a 1D-array forming a row or a column of panels.

3. The at least partially self-powered photovoltaic sunshade and display system any or a combination of 1-2 above and 4-12 below, wherein the plurality of panels are arranged in a 2D-array comprising of at least two rows or at least two columns of panels.

4. The at least partially self-powered photovoltaic sunshade and display system any or a combination of 1-3 above and 5-12 below, wherein the plurality of panels are elongated rectangularly shaped slats, which are arranged as horizontal strips stacked on top of each other or as vertical strips packed next to each other.

5. The at least partially self-powered photovoltaic sunshade and display system any or a combination of 1-4 above and 6-12 below, wherein edges of the of plurality of panels are provided with light-emitting elements.

6. The at least partially self-powered photovoltaic sunshade and display system any or a combination of 1-5 above and 7-12 below, further comprising a motor for rotating the sides.

7. The at least partially self-powered photovoltaic sunshade and display system of 6 above, further comprising a control and a sensor for automatically rotating the sides of the plurality of panels depending on light incident on the plurality of panels.

8. The at least partially self-powered photovoltaic sunshade and display system any or a combination of 1-7 above and 9-12 below, wherein the energy storage means includes a plurality of energy storage devices, and wherein each of the plurality of panels respectively includes one or more of the plurality of energy storage devices.

9. The at least partially self-powered photovoltaic sunshade and display system of 8 alone or in combination with any of above and 1-8 above and 10-12 below, wherein each of the plurality of panels is a standalone device such that
    each of the one or more of the plurality of energy storage devices is charged by the plurality of photovoltaic cells or the photovoltaic layer of the respective panel, and
    each of the one or more of the plurality of energy storage devices provides the electrical power to the array of light-emitting elements of the respective panel.

10. The at least partially self-powered photovoltaic sunshade and display system of 8 above, wherein the plurality of panels are electrically connected such that the one or more of the plurality of energy storage devices of one of the plurality of panels may provide electrical energy to the array of light-emitting elements of another one of the plurality of panels.

11. The at least partially self-powered photovoltaic sunshade and display system of 1-10 above and 12 below, wherein the energy storage means is provided external to the plurality of panels.

12. The at least partially self-powered photovoltaic sunshade and display system of 1-11 above, wherein the energy storage device of each of the plurality of panels is provided at or on the first side of the respective panel.

13. A method of at least partially self-powering a photovoltaic sunshade and display system, the method comprising:
    providing the at least partially self-powered photovoltaic sunshade and display system according to 1-12 above;
    during the day, positioning the plurality of panels with their first side rotated towards the sun and capturing energy and charging each of the panels' storage means; and
    during evening or night, positioning the plurality of panels with their second side rotated towards the exterior environment and using a stored charge of the charged storage means for lighting purposes or for displaying images by means of the array of light-emitting elements.

14. An at least partially self-powered photovoltaic sunshade and display system comprising:
    a covering board having two sides, including an interior side and an exterior side;
    an arrangement of a plurality of photovoltaic cells on the exterior side of said covering board and an energy storage means connected therewith;
    an arrangement of a plurality of light-emitting elements on the interior side of said covering board,
    a plurality of light-emitting element drivers on or in said covering board for each of said plurality of light-emitting elements, or a light-emitting element driver for the plurality of light-emitting elements on or in said covering board or on a separate driver board; and
    one or more sensors including a light sensor on or in the exterior side of said covering board or an IR sensor on or in said covering board.

15. The at least partially self-powered photovoltaic sunshade and display system of 14 above, wherein said covering board is flexible and/or stretchable, or said covering board comprises the plurality of panels arranged in an array, or said covering board is configured to be rolled up or unrolled.

16. A carport comprising the at least partially self-powered photovoltaic sunshade and display system of 14 or 15 above.

17. An at least partially self-powered photovoltaic sunshade and display system comprising:
    a covering board having two sides, including an interior side and an exterior side;
    an arrangement of a plurality of light-emitting elements on the exterior side of said covering board;
    an arrangement of a plurality of photovoltaic cells on the exterior side of said covering board, and a storage means connected with the photovoltaic cells;
    a plurality of light-emitting element drivers on said board for each of said plurality of light-emitting elements, or a light-emitting element driver for the plurality of light-emitting elements on said board or on a separate driver board; and one or more sensors of which at least a light sensor or an IR sensor on the exterior side of said board.

18. The at least partially self-powered photovoltaic sunshade and display system of any or a combination of 17 above and 19-20 below, wherein the plurality of photovoltaic cells are mounted alternatingly in between said light-emitting elements.

19. The at least partially self-powered photovoltaic sunshade and display system or any or a combination of 17-18 above and 20 below, wherein said covering board is flexible and/or stretchable, and/or wherein said covering board can be rolled up or unrolled.

20. The at least partially self-powered photovoltaic sunshade and display system of any or a combination of 17-19 above, wherein said covering board comprises of a plurality of panels arranged in an array.

The invention claimed is:

1. An at least partially self-powered photovoltaic sunshade and display system, comprising a plurality of panels arranged in an array, wherein each of the plurality of panels has at least two sides, including
 a first side including a plurality of photovoltaic cells or a photovoltaic layer, and
 a second side including an array of a plurality of light-emitting diodes (LEDs), and wherein the at least partially self-powered photovoltaic sunshade and display system further comprises a plurality of LED drivers electrically connected to the array of LEDs, one of the plurality of LED drivers being assigned for each of said plurality of the LEDs;

wherein the one or more drivers are configured to drive the array of LEDs of the respective panel to display video;

wherein the at least partially self-powered photovoltaic sunshade and display system further comprises energy storage that receives charge from the plurality of panels and provides electrical power to the array of LEDs for displaying said video;

wherein each of the plurality of panels is rotatable about an axis such that the two sides are respectively rotatable towards or away from the sun, and towards or away from an exterior environment;

wherein the energy storage includes a plurality of energy storage devices, and wherein each of the plurality of panels respectively includes one or more of the plurality of energy storage devices; and wherein the plurality of panels are electrically connected such that the one or more of the plurality of energy storage devices of one of the plurality of panels is configured to provide electrical energy to the array of LEDs of another one of the plurality of panels, wherein each of the plurality of panels is a standalone device such that
 each of the one or more of the plurality of energy storage devices is charged by the plurality of photovoltaic cells or the photovoltaic layer of the respective panel,
 each of the one or more of the plurality of energy storage devices provides the electrical power to the array of LEDs of the respective panel, wherein the display system further includes a control system for controlling said LED drivers, wherein said control system comprises a non-volatile data storage for storing data to be displayed as the video, a board communication system connectable to said plurality of LED drivers, and a controller, adapted for controlling said board communication system and said data storage, and wherein the display system, as the standalone display system, is configured to operate fully autonomously without requiring connections outside the display system while displaying the video due to the data to be displayed being directly stored in advance into a non-volatile data storage of the display system and/or the display system is configured to operate fully independently in terms of operational logic, and wherein, as the standalone display system, the plurality of energy storage devices are configured to supply power to both said plurality of light-emitting element drivers and said control system.

2. The at least partially self-powered photovoltaic sunshade and display system of claim 1, wherein the plurality of panels are arranged in a 1D-array forming a row or a column of panels.

3. The at least partially self-powered photovoltaic sunshade and display system of claim 1, wherein the plurality of panels are arranged in a 2D-array comprising of at least two rows or at least two columns of panels.

4. The at least partially self-powered photovoltaic sunshade and display system of claim 1, wherein the plurality of panels are elongated rectangularly shaped slats, which are arranged as horizontal strips stacked on top of each other or as vertical strips packed next to each other.

5. The at least partially self-powered photovoltaic sunshade and display system of claim 1, wherein edges of the of plurality of panels are provided with LEDs.

6. The at least partially self-powered photovoltaic sunshade and display system of claim 1, further comprising a motor for rotating the plurality of panels respectively about said axis of each of the panels.

7. The at least partially self-powered photovoltaic sunshade and display system of claim 6, further comprising a control and a sensor for automatically rotating the plurality of panels depending on light incident on the plurality of panels.

8. The at least partially self-powered photovoltaic sunshade and display system of claim 1, wherein the energy storage further includes an external energy storage that is external to the plurality of panels.

9. The at least partially self-powered photovoltaic sunshade and display system of claim 1, wherein the one or more of the plurality of energy storage devices of each of the plurality of panels respectively are provided at or on the first side of each the respective plurality of panels.

10. A method of at least partially self-powering a photovoltaic sunshade and display system, the method comprising:
 providing the at least partially self-powered photovoltaic sunshade and display system according to claim 1;
 during the day, positioning the plurality of panels with their first side rotated towards the sun and capturing energy and charging each of the panels' storage; and
 during evening or night, positioning the plurality of panels with their second side rotated towards the exterior environment and using a stored charge of the energy storage for displaying the video by the array of LEDs.

11. A method of at least partially self-powering a photovoltaic sunshade and display system, the method comprising:

providing the at least partially self-powered photovoltaic sunshade and display system according to claim 1;

during the day, positioning the plurality of panels with their first side rotated towards the sun and capturing energy and charging each of the panels' storage; and during evening or night, positioning the plurality of panels with their second side rotated towards the exterior environment and using a stored charge of the energy storage for lighting purposes.

12. The at least partially self-powered photovoltaic sunshade and display system of claim 9, wherein in a case that local energies of different panels of the plurality of panels are different, the at least partially self-powered photovoltaic sunshade and display system is configured to transfer energy from a first local energy storage of a first panel to a second local energy storage of a second panel.

13. The at least partially self-powered photovoltaic sunshade and display system of claim 1, wherein for each of plurality panels, the first side is opposite from the second side.

14. The at least partially self-powered photovoltaic sunshade and display system of claim 1, wherein the array of LEDs and one or more drivers are configured to display video.

15. The at least partially self-powered photovoltaic sunshade and display system of claim 1, wherein the plurality of panels are configured to display the video toward the exterior environment.

16. The at least partially self-powered photovoltaic sunshade and display system of claim 6, wherein the motor is powered entirely or at least in part by the energy storage that receives charge from the plurality of panels.

17. The at least partially self-powered photovoltaic sunshade and display system of claim 1, wherein the plurality of panels are arranged in a 2D-array comprising of at least three rows and at least three columns of panels.

18. The at least partially self-powered photovoltaic sunshade and display system of claim 17, wherein each of the energy storage devices of each of the respective plurality of panels is arranged on the first side of the respective panel.

19. The at least partially self-powered photovoltaic sunshade and display system of claim 18, wherein each of the plurality of panels has a square shape.

20. The at least partially self-powered photovoltaic sunshade and display system of claim 1, wherein the plurality of panels are arranged in a 2D-array comprising of at least two rows and at least two columns of panels.

21. The at least partially self-powered photovoltaic sunshade and display system of claim 1, wherein edges of the of plurality of panels are provided with edge LEDs, wherein the edge LEDs are provided respectively on an edge surface of each of the plurality of panels that extends between the first side and the second side of the plurality of panels.

22. The at least partially self-powered photovoltaic sunshade and display system of claim 21, wherein the edge surfaces of each of the plurality of panels respectively extend perpendicularly to the first side or the second side of the plurality of panels.

23. The at least partially self-powered photovoltaic sunshade and display system of claim 1, wherein said board communication system comprises a board interface that passes the data to be displayed to said light-emitting element drivers and a buffer connected thereto, said buffer used to store the data to be displayed, as it moves from said controller to said board interface.

24. The at least partially self-powered photovoltaic sunshade and display system of claim 1, wherein said control system further comprises a wireless communications interface that provides wireless communications and wherein said controller is further adapted for controlling said communications interface.

25. An at least partially self-powered photovoltaic sunshade and display system, comprising a plurality of panels arranged in an array, wherein each of the plurality of panels has two sides, including
  a first side including a plurality of photovoltaic cells or a photovoltaic layer, and
  a second side including an array of a plurality of light-emitting elements (LEEs), wherein the at least partially self-powered photovoltaic sunshade and display system further comprises a plurality of LEE drivers electrically connected to the array of LEEs, wherein the one or more drives are configured to drive the array of LEEs to display video, one of the plurality of LEE drivers being assigned for each of said plurality of the LEEs;

wherein the at least partially self-powered photovoltaic sunshade and display system further comprises energy storage that receives charge from the plurality of panels and provides electrical power to the array of LEEs for displaying said video;

wherein each of the plurality of panels is rotatable about an axis such that the two sides are respectively rotatable towards or away from the sun, and towards or away from an exterior environment;

wherein the energy storage includes a plurality of energy storage devices, and wherein each of the plurality of panels respectively includes one or more of the plurality of energy storage devices; and wherein the plurality of panels are electrically connected such that the one or more of the plurality of energy storage devices of one of the plurality of panels is configured to provide electrical energy to the array of LEEs of another one of the plurality of panels, wherein each of the plurality of panels is a standalone device such that
  each of the one or more of the plurality of energy storage devices is charged by the plurality of photovoltaic cells or the photovoltaic layer of the respective panel,
  each of the one or more of the plurality of energy storage devices provides the electrical power to the array of LEEs of the respective panel, wherein the display system further includes a control system for controlling said LEE drivers, wherein said control system comprises a non-volatile data storage for storing data to be displayed as the video, a board communication system connectable to said plurality of LEE drivers, and a controller, adapted for controlling said board communication system and said data storage, and wherein the display system, as the standalone display system, is configured to operate fully autonomously without requiring connections outside the display system while displaying the video due to the data to be displayed being directly stored in advance into a non-volatile data storage of the display system and/or the display system is configured to operate fully independently in terms of operational logic, and wherein, as the standalone display system, the plurality of energy storage devices are configured to supply power to both said plurality of light-emitting element drivers and said control system.

26. The at least partially self-powered photovoltaic sunshade and display system of claim 25, wherein the array of light-emitting elements (LEEs) is configured as a liquid crystal display.

27. The at least partially self-powered photovoltaic sunshade and display system of claim 25, wherein the light-emitting elements (LEEs) are light-emitting diodes (LEDs).

28. The at least partially self-powered photovoltaic sunshade and display system of claim 25, wherein each of the plurality of panels respectively comprises one or more drivers that are configured to drive the array of LEEs to display the video.

\* \* \* \* \*